(12) United States Patent
Freeman

(10) Patent No.: US 9,554,480 B2
(45) Date of Patent: Jan. 24, 2017

(54) ELECTRICAL ENCLOSURE OPERATING MECHANISM HOUSING AN EXTERNAL ANTENNA

(71) Applicant: SCHNEIDER ELECTRIC USA, INC., Palatine, IL (US)

(72) Inventor: Alan Freeman, Raleigh, NC (US)

(73) Assignee: Schneider Electric USA, Inc., Andover, MA (US)

( * ) Notice: Subject to any disclaimer, the term of this patent is extended or adjusted under 35 U.S.C. 154(b) by 121 days.

(21) Appl. No.: 14/534,544

(22) Filed: Nov. 6, 2014

(65) Prior Publication Data

US 2016/0135313 A1    May 12, 2016

(51) Int. Cl.
*G06F 1/16* (2006.01)
*H05K 5/02* (2006.01)
(Continued)

(52) U.S. Cl.
CPC .............. *H05K 5/0247* (2013.01); *H01H 3/02* (2013.01); *H01H 9/168* (2013.01); *H01H 9/22* (2013.01);
(Continued)

(58) Field of Classification Search
CPC ........ E05B 81/78; E05B 85/16; E05B 13/002; E05B 47/0657; E05B 17/10; E05B 41/00; E05B 79/06; E05B 81/76; E05B 65/46; Y10T 292/57; Y10T 292/0946; Y10T 70/5761; Y10T 70/577; Y10T 292/1076; Y10T 292/0828; Y10T 292/0831; Y10T 292/0917; Y10T 292/093; Y10T 292/1039; Y10T 292/1077; Y10T 403/595; Y10T 74/20; H01H 9/22; H01H 9/283; H01H 3/42; H01H 71/0264; H01H 71/524; H01H 3/04; H01H 71/04; H01H 9/02; H01H 9/104; H01H 9/168; H01H 3/02; H01H 71/521; E05C 3/042; H02B 11/133; Y10S 292/30; Y10S 292/31; H05K 7/1409; H05K 5/0247; A47B 95/02; H01R 13/62938
(Continued)

(56) References Cited

U.S. PATENT DOCUMENTS 3,629,536 A * 12/1971 Rys .......................... H01H 9/22
                                                          200/294
6,490,896 B2 * 12/2002 Segawa ................ E05B 1/0092
                                                          292/336.3
(Continued)

FOREIGN PATENT DOCUMENTS

EP    0946085    9/1999
EP    1006028    6/2000
(Continued)

OTHER PUBLICATIONS

European Search Report for Application No. 15193056.7-1808 dated Mar. 11, 2016.

*Primary Examiner* — Courtney Smith
*Assistant Examiner* — James Wu
(74) *Attorney, Agent, or Firm* — Locke Lord LLP

(57) ABSTRACT

An operating mechanism is provided for an electrical enclosure. The operating mechanism includes a switch operator, and a housing to house the switch operator. The switch operator includes a portion which extends through one of one or more holes in the electrical enclosure, and can be manipulated by an external handle to operate an electrical switching device, such as a circuit breaker, that is housed in the electrical enclosure. The housing includes a cavity to house and protect an external antenna or other electrical device, which is connectable to an electrical cable that
(Continued)

extends from the cavity into an interior of the electrical enclosure via the hole(s). The electrical cable can be connected to a monitoring system inside of the electrical enclosure. The housing is mountable onto an exterior surface of a wall of the electrical enclosure to cover the hole(s).

10 Claims, 6 Drawing Sheets

(51) Int. Cl.
*H01H 9/16* (2006.01)
*H01H 71/52* (2006.01)
*H01H 3/02* (2006.01)
*H01H 9/22* (2006.01)
*E05B 81/76* (2014.01)
*H01H 9/02* (2006.01)
*E05B 41/00* (2006.01)

(52) U.S. Cl.
CPC ............ *H01H 71/521* (2013.01); *E05B 41/00* (2013.01); *E05B 81/76* (2013.01); *H01H 9/02* (2013.01); *Y10T 74/20* (2015.01); *Y10T 292/1039* (2015.04); *Y10T 292/1076* (2015.04); *Y10T 292/1077* (2015.04); *Y10T 292/57* (2015.04)

(58) Field of Classification Search
USPC ..... 361/643, 679.58, 679.59, 724, 726, 819, 361/834; 200/41.11, 41.14, 237, 293, 295, 200/296, 332, 332.2, 333, 335; 312/332.1, 312/348.6; 70/207; 292/198, 336.3, 95, 292/97, 98, 100, 200; 343/872, 873
See application file for complete search history.

(56) References Cited

U.S. PATENT DOCUMENTS

| 8,317,351 | B2 | 11/2012 | Brown et al. |
| 8,372,495 | B2 | 2/2013 | Kenney |
| 2006/0226953 | A1* | 10/2006 | Shelley .................. B60R 25/00 340/5.62 |
| 2007/0240463 | A1* | 10/2007 | Antonucci ............ E05B 1/0092 70/208 |
| 2010/0088856 | A1* | 4/2010 | Mueller .................. E05B 81/78 16/421 |
| 2014/0203574 | A1* | 7/2014 | Noda ...................... E05B 81/77 292/336.3 |

FOREIGN PATENT DOCUMENTS

| EP | 1099406 | 5/2001 |
| EP | 1461234 | 11/2001 |
| EP | 1418768 | 5/2004 |
| EP | 1788598 | 5/2007 |
| EP | 1099407 | 12/2007 |
| EP | 2166633 | 3/2010 |
| WO | WO03009419 | 1/2003 |
| WO | WO2004021401 | 3/2004 |
| WO | WO2014044736 | 3/2014 |

* cited by examiner

FIG. 3 OPERATING MECHANISM IN OFF POSITION

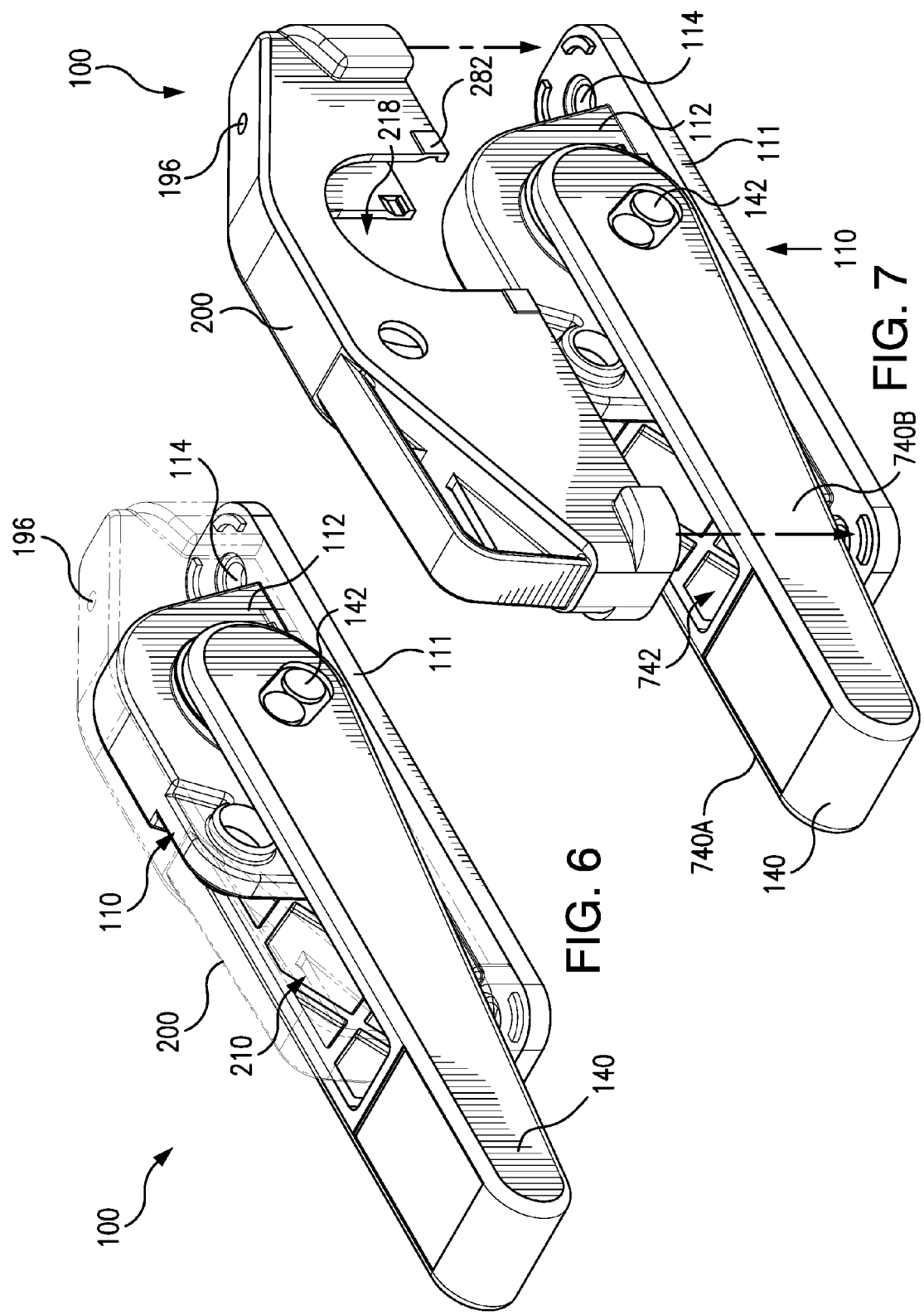

ELECTRICAL ENCLOSURE OPERATING MECHANISM HOUSING AN EXTERNAL ANTENNA

FIELD

The present disclosure is related to an external operating mechanism for an electrical enclosure, and more particularly to an external operating mechanism that houses and protects an electrical device such as an external antenna.

BACKGROUND

Power management systems for residential or other facilities may employ wireless communication modules or equipment to communicate energy measurements or parameters monitored at various locations, such as at a load center which is also referred to as a panelboard in certain applications. A wireless communication module can include a radio antenna and radio circuitry, which are provided at each monitored location. When monitoring an electrical panel such as a panelboard, the electrical enclosure of the panelboard may interfere with radio signal transmission if the antenna is arranged in the enclosure. Moreover, the radio signal transmission may interfere with fault detection and other circuitry if the antenna is positioned inside the enclosure. However, if the radio antenna is positioned externally such as through a hole in the enclosure, the integrity of the enclosure is compromised by the hole created for the radio antenna and may not satisfy industry standards, such as UL mechanical, electrical and flammability requirements. In addition, there is a possibility that the radio antenna may pose a potential shock hazard to a user if the insulation for the antenna's electrical cable becomes compromised and line voltage electrical power is transmitted to the antenna.

SUMMARY

To address these and other shortcomings, an antenna or other electrical devices can be incorporated into an external operating mechanism for an electrical enclosure, such as to operate one or more electrical switching devices housed inside of the electrical enclosure. The operating mechanism is mounted on an exterior surface of a wall of the electrical enclosure. The operating mechanism incorporates a cavity or the like to house the antenna and other electrical devices, which can be electrically connected via an electrical cable to a component, such as a monitoring system, inside of the electrical enclosure. The electrical cable can extend into or out of the electrical enclosure through an enclosure hole which is covered by the operating mechanism. The enclosure hole can be an existing hole typically covered and used by an operating mechanism, such as a flange mounted operating handle for use with a circuit breaker operating system (e.g., Square D Class 9422 A1 Disconnect Switch). Accordingly, by incorporating the antenna or other electrical devices into an external operating mechanism for an electrical enclosure, it is possible to minimize interference inside of the electrical enclosure. It is further possible to minimize the need to create any additional holes in the electrical enclosure by using an existing hole in the electrical enclosure, and to protect the antenna or other electrical devices from hostile environmental conditions.

In one example, the operating mechanism can include a switch operator, and a housing to house the switch operator and other components therein. The switch operator includes a portion which extends through the hole in the electrical enclosure, and can be automatically or manually manipulated to operate the electrical switching device that is housed in the electrical enclosure. The housing includes a cavity to house and protect an antenna or other electrical device, which is connectable to an electrical cable that extends from the cavity into an interior of the electrical enclosure via the hole. The housing is mountable onto an exterior surface of a wall of the electrical enclosure to cover the hole. The operating mechanism can also include an interlock to prevent a door of the electrical enclosure from being unlocked when the operating mechanism is in the ON position (e.g., with the electrical switching device turned ON to allow current flow).

Furthermore, the housing configuration for the components of the operating mechanism can be a two piece snap-fit assembly. For example, the housing for the operating mechanism can include an outer first cover and an inner second cover. The first cover includes a cavity or the like to house an antenna or other electrical device. The first cover is connectable onto or over the second cover, with snap-fit joints. The second cover houses the switch operator and is mounted over the hole of the electrical enclosure. An electrical cable, which is connected to the antenna or other electrical device, can be extended from the cavity through the hole in the electrical enclosure, via a cable opening in the second cover. The cable opening can include a sealing element, such as a cable gasket or cable gland, to allow a portion of the electrical cable to extend therethrough, while substantially sealing the cable opening.

BRIEF DESCRIPTION OF THE DRAWINGS

The description of the various exemplary embodiments is explained in conjunction with the appended drawings, in which:

FIG. 6 illustrates a perspective view of the operating mechanism of FIG. 2 in which the first cover is shown in a transparent manner to provide a better view of the base and handle of the operating mechanism which are shown in unbroken lines.

FIG. 7 illustrates a perspective view of the operating mechanism of FIG. 6 showing an exploded view of the first cover and the base and handle of the operating mechanism, all in unbroken lines.

DETAILED DESCRIPTION OF THE EXAMPLE EMBODIMENTS

Figure 1:
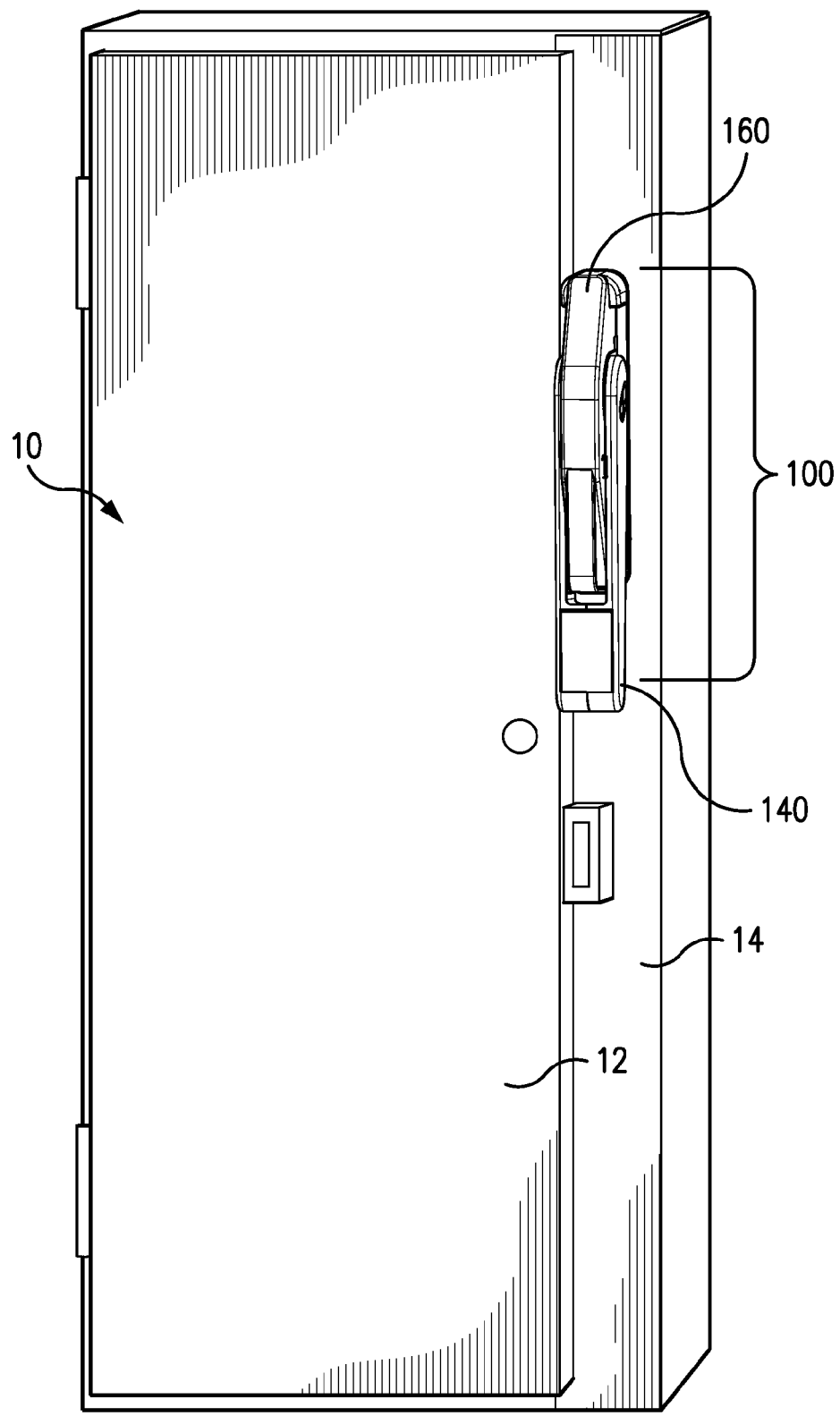
FIG. 1 illustrates an example of an electrical enclosure with an external operating mechanism to house and protect an antenna and other electrical devices in accordance with an embodiment of the present disclosure.

Referring to FIG. 1, an electrical enclosure 10 includes a door 12 and a flange 14 adjacent to the door 12. An operating mechanism 100 is mounted onto an exterior surface of a wall of the electrical enclosure 10, such as a portion of the flange 12. The operating mechanism 100 includes an external handle 140 and a housing 160 to house and protect various mechanical and electrical components. The operating mechanism 100 allows for external operation of electrical equipment that is housed inside of the electrical enclosure 10, via one or more holes of the electrical enclosure. The electrical equipment can include one or more electrical switching devices (e.g., electrical switches, circuit breakers, relays, etc.) which are manually or automatically operable via the operating system 100. Furthermore, the operating mechanism 100 is configured to house and protect one or more electrical devices outside of the electrical enclosure 10. The electrical devices can include an antenna of a wireless transmitter and/or receiver along with other electrical devices. The operating mechanism 100 can utilize an already-existing hole(s) in the electrical enclosure to allow electrical connection of the electrical device(s) to other components inside of the electrical enclosure 10, such as components of a monitoring system. The monitoring system can include various types of sensors for monitoring conditions inside of the electrical enclosure 10, such as a temperature sensor, current sensor (e.g., a current transformer), trip sensor, or other types of sensors used to monitor equipment housed in the electrical enclosure 10.

Accordingly, the operating mechanism 100 allows antennas and other electrical devices to be housed outside of an electrical enclosure, and protects them from hostile environmental conditions often found inside and outside of the electrical enclosure. For example, by housing them outside of the electrical enclosure, it is possible to reduce overheating of their electrical components due to the cooler temperatures outside of the electrical enclosure. Furthermore, such an arrangement reduces the risk of Electromagnetic Compatibility (EMC) interference between an antenna and electrical equipment housed inside of the electrical enclosure. Since the operating mechanism 100 is configured to protect an antenna from the outside environment, it is also possible to use antennas that are rated for indoor use with electrical enclosures (though antennas rated for outdoor use can also be employed if desired).

An example of the components and operations of the operating mechanism 100 is discussed below with reference to the other figures. For the purposes of explanation, in this example, the operating mechanism 100 is configured to house and protect various mechanical and electrical components in two separate sub-assemblies, namely an outer first cover and an inner second cover associated with a base portion of the operating mechanism 100. For instance, as shown in FIG. 2, the operating mechanism 100 can include a base 110, the handle 140, and a first cover 200 connected onto or over at least a portion of the base 110.

The first cover 200 can include one or more cavities and passageways to house and protect one or more electrical devices and their electrical cables. For example, the first cover 200 includes a first cavity 210, second cavity 220, third cavity 230 and passageway 240 between the cavities 210 and 230. The first cavity 210 is configured to receive and house an electrical device 190, which includes an antenna 192 to conduct wireless communications with one or more remote systems or devices (e.g., Building Management System (BMS), central monitoring system, user device such as a computer tablet or smartphone, etc.). The electrical device 190 can also include other electrical components 194 such as for example wireless transmitter circuitry, wireless receiver circuitry, an LED drive circuit and a controller for controlling the operations of the components of the electrical device, all of which can be configured onto one or more printed circuit boards (PCBs). The second cavity 220 is configured to receive and house the base 110, when the first cover 200 is connected onto or over the base 110. The third cavity 230 is configured to receive and house another electrical device, such as a status indicator 196, which is mounted to the first cover 200. The status indicator 196 can be a light emitting diode (LED) as shown in FIG. 2, or some other output device which is configured to reflect a status of the equipment inside of the electrical enclosure 10. The status indicator 196 is electrically coupled to the electrical device 190, via one or more electrical cables 194B, which can provide power, data and/or control signals to the status indicator 196 from the electrical device 190. The first cover 200 can also include other features, such as a padlocking opening 260.

The base 110 can include a second cover 112, which houses and protects other components of the operating mechanism 100, which for example relate to the primary operation of the operating mechanism 100. In this example, the operating mechanism 100 is configured to control the operations of one or more electrical switching devices (e.g., electrical switches, circuit breakers, relays, etc.) and a lock mechanism for the door 12 of the electrical enclosure 10 (in FIG. 1). The components housed in the base 110 and their operations will be discussed in greater detail below with reference to FIGS. 3-5.

Figure 2:
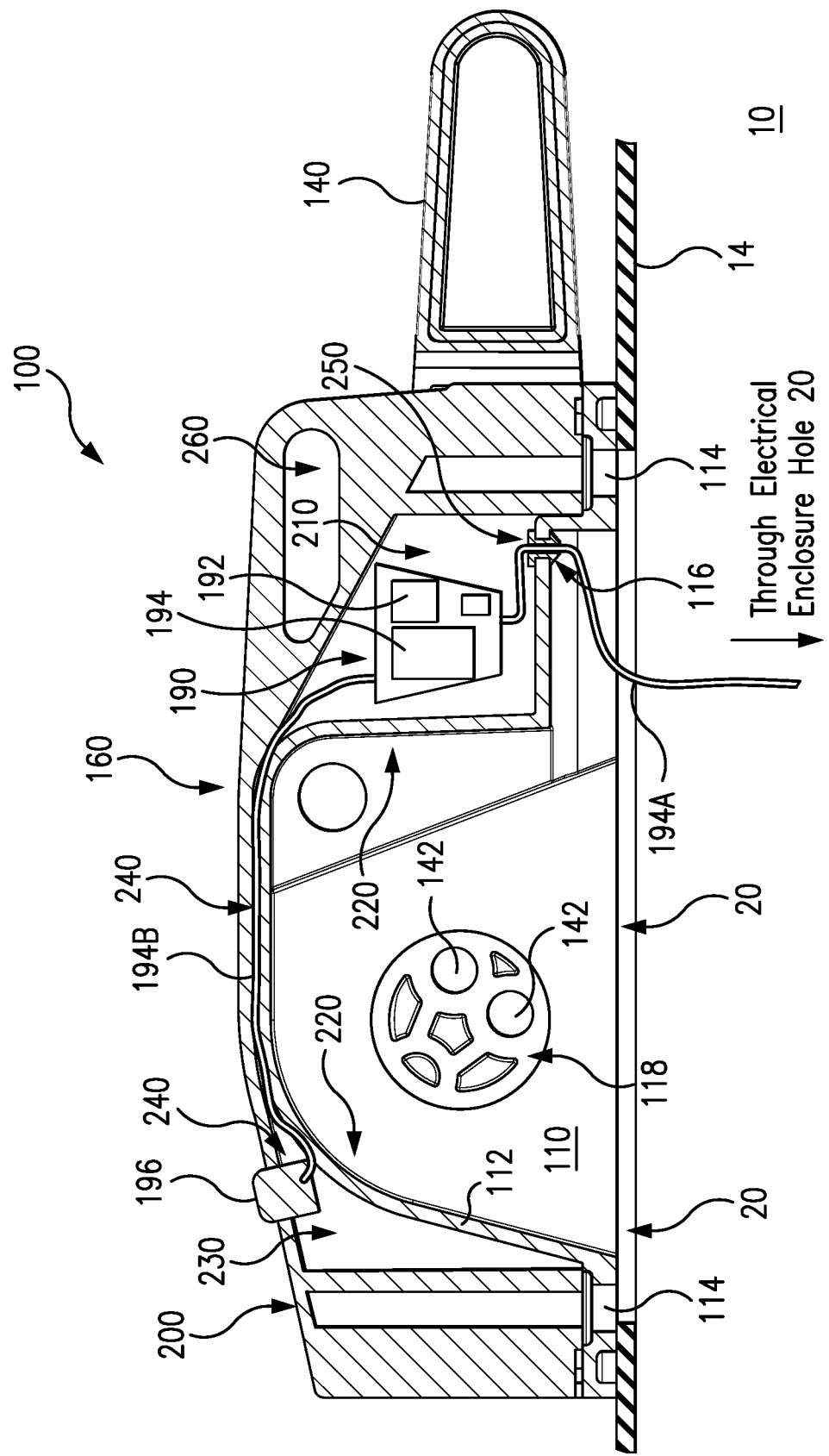
FIG. 2 illustrates a partial cross-sectional view of example components for an operating mechanism, such as the operating mechanism of FIG. 1, which houses and protects an external antenna and other electrical devices.

As further shown in FIG. 2, the base 110 also includes a cable opening 116 that extends through the second cover 112 and is positioned relative to the first cavity 210 of the first cover 200. The cable opening 116 enables one or more electrical cables to extend from the first cavity 210, through the base 110 and into an interior of the electrical enclosure 10 via the hole(s) 20. A sealing element 250 can be used to seal the cable opening 116 in the second cover 112 so that the base 110 can substantially seal the hole(s) 20 of the electrical enclosure 10 from the outside environment when mounted thereon.

The base 110 also includes a plate portion 111, best seen in FIG. 6 and FIG. 7, with one or more fastener openings 114 configured to receive a fastener for mounting the operating mechanism 100 onto the electrical enclosure. The fastener openings 114 may be threaded to receive a bolt or screw. Furthermore, the second cover 112 of the base 110 includes a pair of opposing side openings 118, which allows a portion of the handle 140 to be connected to components therein via handle fasteners 142 (e.g., pins or screws).

Figure 3:
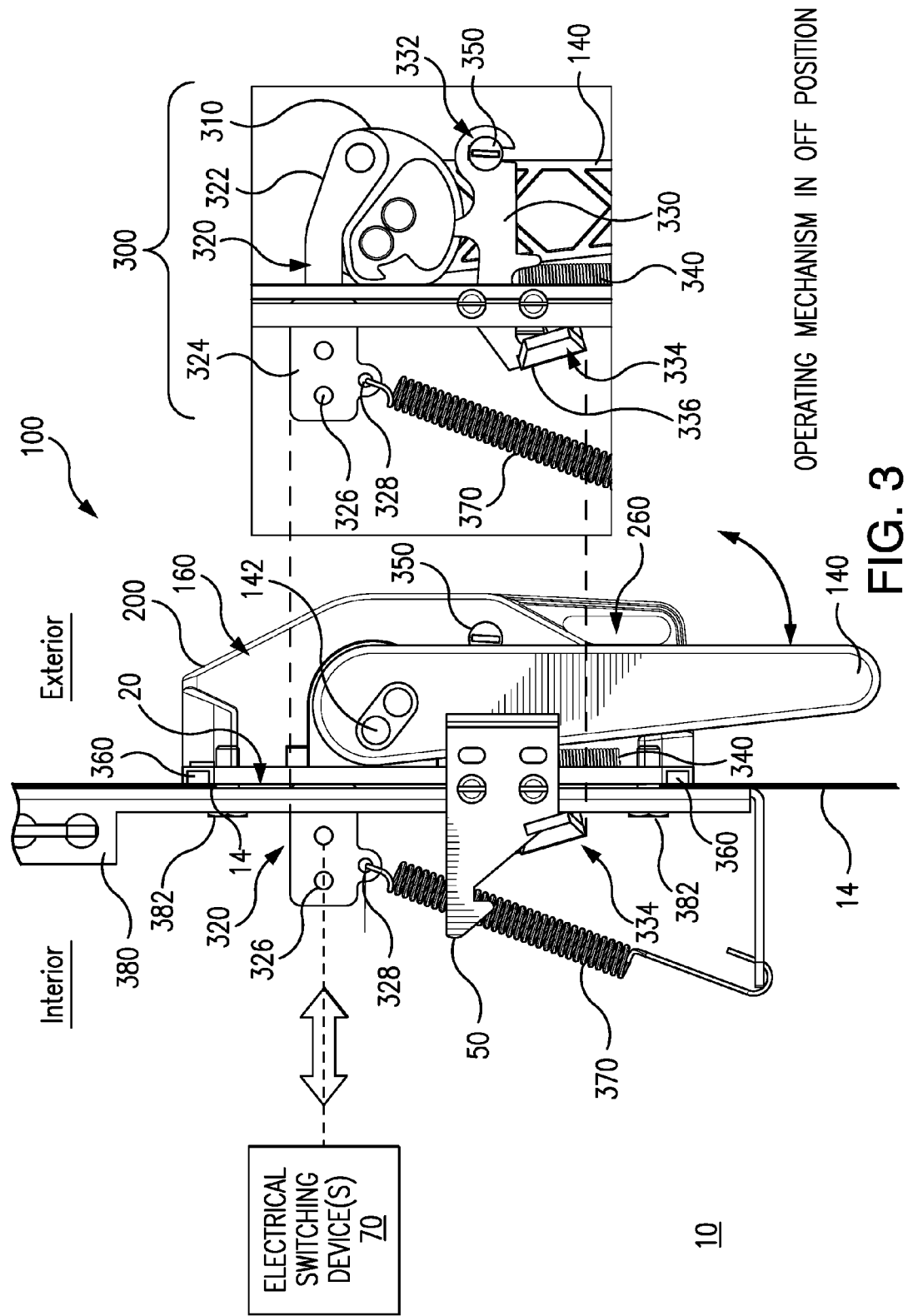
FIG. 3 illustrates a side view of the operating mechanism of FIG. 2 for the electrical enclosure with the operating mechanism in an OFF position.

Turning to FIG. 3, the base 110 can also include a gasket 360 which is housed in a bottom thereof in a continuous circumferential groove which extends around a periphery on the bottom of the base 110 in the plate portion 111. The gasket 360 is a continuous sealing element, which is used to substantially seal the hole(s) 20 of the electrical enclosure 10 when the operating mechanism 100 including the base 110 is mounted onto the exterior surface of the wall of the electrical enclosure 10 over the hole(s) 20. The operating mechanism 100 is mounted onto the exterior surface of the electrical enclosure 10 using mounting fasteners 382 (e.g., bolts or screws) in combination with a mounting bracket 380 arranged on an opposite interior surface of the electrical enclosure.

The base 110 further includes a switch operator 300 and an interlock 330. The switch operator 300 includes a cam 310 and a coupling link 320. The coupling link 320 includes a first end 322 and a second end 324 opposite the first end 322. The first end 322 of the coupling link 320 is movably connected to the cam 310. The second end 324 of the coupling link 310 includes one or more coupling holes 326, and a spring hole 328 for receiving one end of a handle return spring 370 (shown only partially in FIG. 4 for ease of illustration) which has the other end connected to the mounting bracket 380. The coupling link 320 is operatively connected to one or more electrical switching devices 70, such as electrical switches, circuit breakers, relays, and so forth. For instance, the coupling link 320 can be connected 26 to actuate one or more electrical switching devices 70 via an intermediary mechanism (e.g., an operating rod or lever) connected to the coupling link 320 by the coupling holes 324. The handle 140 is connected to the cam 320 via handle fasteners 142 (e.g., pins or screws), and is operable to rotate the cam 310 which in turn causes linear movement of the coupling link 320 between the ON position and OFF position. For example, in the ON position, the switching device(s) 70 allows current flow between a power source and a load. In the OFF position, the switching device(s) 70 interrupts current flow therebetween.

The interlock 330 includes a first end 332 and a second end 334 opposite the first end 332. The interlock 330 is connected on its first end 332 to the base 110 (or particularly its second cover 112) via a defeater screw 350. The second end 334 of the interlock 330 includes an interlock lever 336 which is movable between a locked or unlocked position relative to a locking bracket (or blade) 50. The base 110 also includes an interlock return spring 340.

Figure 4:
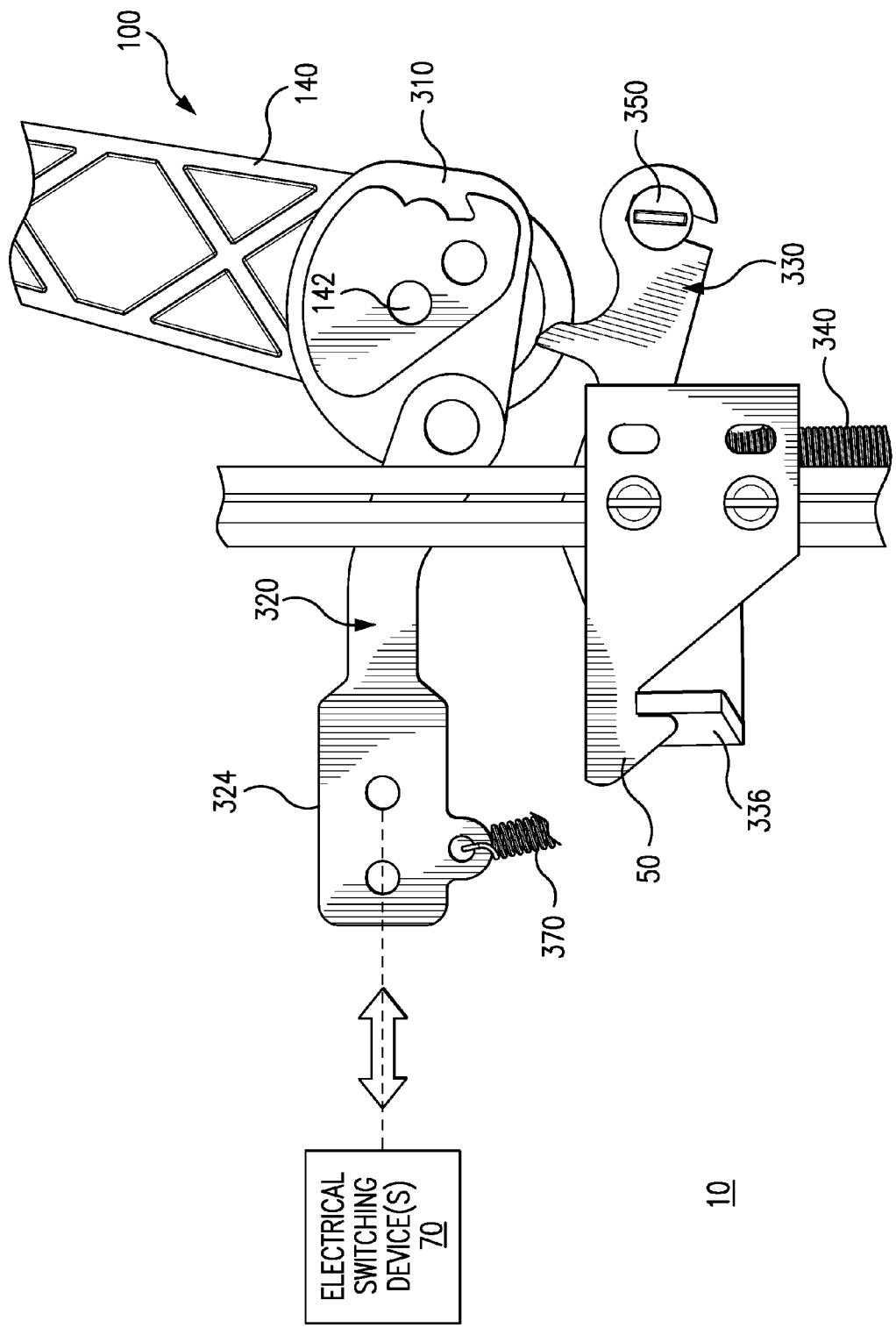
FIG. 4 illustrates example components of the operating mechanism, as shown in FIG. 3, with the operating mechanism in an ON position.

In operation, when the door 12 (e.g., in FIG. 1) of the electrical enclosure 10 is in the open position and the handle 140 is in the OFF position (e.g., down position) as shown on the right side of FIG. 3 (without the locking bracket 50), the return spring 340 pushes the interlock 330 into contact with the cam 310 handle 140 which prevents operation of the handle 140 into the ON position (e.g., up position). In FIG. 4, the door 12 (e.g., in FIG. 1) of the electrical enclosure 10 is in the closed position, which pushes the interlock 330 down so the interlock lever 336 is no longer in contact with the cam 310. Thus, the handle 140 is allowed to move to the ON position in which the coupling link 320 is moved farther into the electrical enclosure 10 in order to actuate, e.g., turn on, the electrical switching device 70. However, when the handle 140 is in the ON position, the interlock 330 prevents the door 12 (e.g., in FIG. 1) of the electrical enclosure 10 from being opened.

Figure 5:
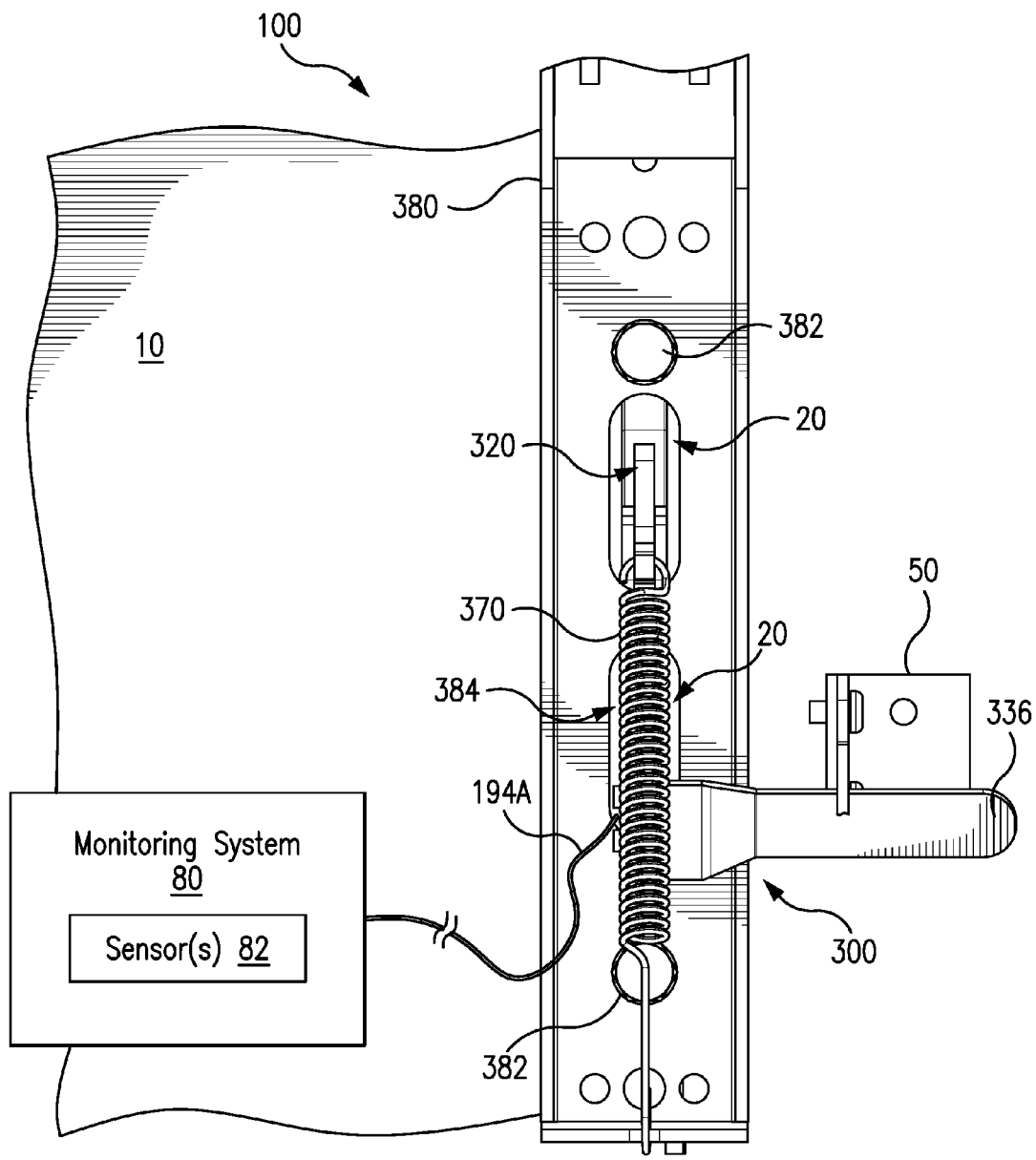
FIG. 5 illustrates a bottom view of the operating mechanism of FIG. 2 from an interior of the electrical enclosure, with an electrical cable (connected to the antenna and other electrical devices) extending into the interior of the electrical enclosure via one of one or more holes of the electrical enclosure which are covered and substantially sealed by the operating mechanism.

FIG. 5 illustrates a bottom view of the operating mechanism 100 of FIG. 2 from an interior of the electrical enclosure 10. As shown, the electrical cable 194A extends into an interior of the electrical enclosure 10 via the hole(s) 20 of the electrical enclosure 10 and a bracket opening 384 of the mounting bracket 380. In the electrical enclosure 10, one end of the electrical cable 194A can be connected to an electrical system, such as a monitoring system 80 which can include one or more sensors 82 (e.g., a temperature sensor, current sensor, trip sensor, etc.) As previously discussed, the other end of the electrical cable 194A is connected to the electrical device 190 housed in the operating mechanism 100, as shown in FIG. 3. The electrical cable can provide power, data and/or signals between the electrical device 190 and the monitoring system 80.

FIGS. 6 and 7 further illustrate additional views of the base 110, the handle 140 and the first cover 200 of the operating mechanism 100 of FIG. 2. As shown in FIG. 7, the first cover 200 can include one or more snap-fit joints 282 arranged at one or more locations along a periphery of a bottom of the cover 200. The snap-fit joints 282 can be resilient members which engage associated tabs or grooves on the second cover 112 of the base 110, when the first cover 200 is connected onto or over the base 110 and its second cover 112. The first cover 200 also includes opposing side openings 218 which allow a portion of the handle 140 to extend therethrough and connect with the cam 310 (as shown in FIG. 3) via the handle fasteners 142. As further shown in FIG. 7, the handle 140 can be formed of two thin pieces 740A and 740B which when connected together form a hollow cavity 742. The hollow cavity 742 is configured to provide sufficient clearance for the handle 140 in relations to the first cover 200 when operating the handle 140 between the ON and OFF positions.

The operating mechanism 100 as described herein is provided as an example of an operating mechanism (e.g., a through door mechanism) for an electrical enclosure, which can incorporate an antenna or other electrical devices. An antenna and other electrical devices can be incorporated into a housing of other types of operating mechanisms that are mounted onto an exterior surface of an electrical enclosure and over a hole of the electrical enclosure. The antenna or other electrical devices can be powered through a battery, through the monitoring system which may include a current transformer, or by some other power source. The operating mechanisms can also incorporate sealing elements, such as gaskets or glands, to substantially seal the hole of the electrical enclosure to satisfy standards or recommendations, such as set forth by National Electrical Manufacturer Association (NEMA).

Although the operating mechanism is described as being mounted on a flange of the electrical enclosure, it can be mounted at any suitable location on an exterior surface of the enclosure (e.g., a non-flange mounted operating mechanism). The various components of the operating mechanism, including, for example, the first cover 200, the second cover 112 and the handle 140, can be formed of a dielectric material, such as plastic, and can also have some components formed of metal or with metal coating or plating depending on the application.

Although the operating mechanism 100 is shown with multiple cavities and passageways having a particular dimension and shape, the cavities and passageways can be configured in any desired dimension and shape according to the desired application, such as the dimension, shape and/or location of the antenna and other electrical devices to be housed therein, of the switch operator, of the interlock assembly, of the handle, and of the hole(s) of the electrical enclosure. Furthermore, the operating mechanism 100 can employ one or more cavities to house and protect various components, such as the base, the antenna and other electrical devices, the electrical cables, and so forth. For example, the operating mechanism can have a single-piece housing with a large cavity having a suitable shape and dimension to allow for the securing of an antenna and/or other electronics within that cavity along with other components of the mechanism. Alternatively, the housing of the operating mechanism can be formed of plastic that can contain a molded-in antenna instead of having a cavity formed therein for the antenna.

Words of degree, such as "about", "substantially", and the like are used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention.

The invention claimed is:

1. An operating mechanism for an electrical enclosure comprising:
    an electrical device comprising an antenna;
    a switch operator to operate an electrical switching device housed in the electrical enclosure via a hole from one or more holes in the electrical enclosure; and
    a housing to house the switch operator, the housing further housing the electrical device connectable to an electrical cable which is extendable from inside of the housing into an interior of the electrical enclosure via one of the one or more holes, the housing mountable onto an exterior surface of a wall of the electrical enclosure to cover the one or more holes and wherein the switch operator comprises:
    a movable cam;
    a coupling link connected to the movable cam and extending through one of the one or more holes of the electrical enclosure to operate the electrical switching device;
    wherein the housing comprises a first cover and a second cover, the first cover being connectable over the second cover and including a first cavity for housing the antenna, the second cover housing the switch operator, housing forming a base that is mountable onto the exterior surface of the wall over the one or more holes; and
    an external handle connected to operate the switch operator, wherein the housing includes a side opening through which to connect the external handle to the movable cam.

2. The operating mechanism of claim 1, wherein the base further includes a cable opening through which to extend the electrical cable from the cavity of the first cover through the one or more holes of the electrical enclosure.

3. The operating mechanism of claim 2, further comprising a sealing element arranged in the cable opening, the sealing element comprising a cable gasket or a cable gland.

4. The operating mechanism of claim 1, wherein the first cover includes a second cavity to receive and house the second cover.

5. The operating mechanism of claim 1, wherein the first cover includes one or more snap-fit joints to snap onto the second cover.

6. The operating mechanism of claim 1, further comprising:
    an interlock to prevent opening of a door of the electrical enclosure when the electrical switching device is in an ON position.

7. The operating mechanism of claim 1, further comprising a mounting fastener to fasten the housing onto the exterior surface of the wall of the electrical enclosure over the one or more holes.

8. The operating mechanism of claim 1, further comprising the electrical enclosure having the one or more holes, wherein the exterior surface of the wall of the electrical enclosure is part of a flange portion of the electrical enclosure that is adjacent to a door of the electrical enclosure.

9. The operating mechanism of claim 8, further comprising the electrical cable to extend from inside the housing into the interior of the electrical enclosure via one of the one or more holes.

10. The operating mechanism of claim 1, further comprising a status indicator mounted in the housing and electrically connected to the electrical device via a second electrical cable which is housed in the housing.

* * * * *